United States Patent [19]
Dai et al.

[11] Patent Number: 5,896,071
[45] Date of Patent: Apr. 20, 1999

[54] SURFACE WAVE DEVICE BALUN RESONATOR FILTERS

[75] Inventors: Ji-Dong Dai; Yufeng Xu, both of Kanata; Thomas Philip Cameron, Stittsville, all of Canada

[73] Assignee: Northern Telecom Limited, Montreal, Canada

[21] Appl. No.: 08/856,701

[22] Filed: May 15, 1997

[51] Int. Cl.$^6$ .................................... H03H 9/64
[52] U.S. Cl. ............... 333/193; 310/313 B; 310/313 D; 333/195
[58] Field of Search .................. 333/193–196; 310/313 R, 313 B, 313 C, 313 D

[56] References Cited

U.S. PATENT DOCUMENTS

| | | | |
|---|---|---|---|
| 3,810,257 | 5/1974 | Jones et al. | 333/30 R |
| 4,539,502 | 9/1985 | Este et al. | 310/313 |
| 4,866,325 | 9/1989 | Kodama et al. | 310/313 B |
| 5,365,138 | 11/1994 | Saw et al. | 310/313 |
| 5,475,348 | 12/1995 | Hode et al. | 333/194 X |
| 5,499,003 | 3/1996 | Davenport | 333/195 |
| 5,568,002 | 10/1996 | Kawakatsu et al. | 310/313 B |
| 5,661,444 | 8/1997 | Dill et al. | 333/193 X |

FOREIGN PATENT DOCUMENTS

WO 97/00556  1/1997  WIPO .

OTHER PUBLICATIONS

"A New Compact SAW Low Loss Filter for Mobile Radio", M. Solal et al., Proc. of the Ultrasonics Symposium, Baltimore, Oct. 31, 1993, XP000473549, pp. 105–109.

Primary Examiner—Robert Pascal
Assistant Examiner—Barbara Summons
Attorney, Agent, or Firm—R. John Haley

[57] ABSTRACT

A surface wave device comprises first and second SPUDT (single phase unidirectional transducer) resonator filters each comprising first and second transducers, which are preferably RSPUDTs (resonant SPUDTs), the resonator filters being the same except that one transducer of the second resonator filter is a mirror image of the corresponding transducer of the first resonator filter to provide a phase difference of 180°. The surface wave device serves as a balun by having an unbalanced signal connection to the first transducers, and a balanced signal connection comprising signal connections to the second transducer of each of the first and second resonator filters. The resonator filters can be arranged side by side on a common piezoelectric substrate.

27 Claims, 3 Drawing Sheets

SURFACE WAVE DEVICE BALUN RESONATOR FILTERS

REFERENCE TO RELATED APPLICATION

Reference is directed to U.S. Pat. Application Ser. No. 08/774,857 filed Dec. 18, 1996 in the names of Ji-Dong Dai et al. and entitled "Surface Wave Device Filters Using Resonant Single Phase Unidirectional Transducers", the entire disclosure of which is hereby incorporated herein by reference.

This invention relates to surface wave device balun resonator filters, i.e. surface wave device resonator filters which provide a conversion between balanced (differential) and unbalanced (single-ended) signals. The term "surface wave" is used herein to embrace surface acoustic waves (SAWs), including leaky SAWs, and surface skimming bulk waves.

BACKGROUND OF THE INVENTION

It is known to filter signals, such as RF (radio frequency) and/or IF (intermediate frequency) signals in transmitters and/or receivers of wireless communications equipment, using surface wave device resonator filters. It is also known for such resonator filters to provide for conversion between balanced and unbalanced signals, so that the need for a separate balun transformer is avoided.

For example, Saw et al. U.S. Pat. No. 5,365,138 issued Nov. 15, 1994 and entitled "Double Mode Surface Wave Resonators" describes a WCR (waveguide or transversely coupled resonator) filter in which one of two IDTs (interdigital transducers) and its outer rail are divided into two oppositely phased halves for providing a balanced signal connection, and the other IDT provides an unbalanced signal connection, so that the filter provides a balun function. LCR (longitudinally coupled resonator) filters similarly providing a balun function are described for example in an International Patent Application published Jan. 3, 1997, Publication No. WO 97/00556, entitled "Cascaded Surface Wave Device Filters".

The related application referred to above describes and claims surface wave device resonator filters using SPUDTs (single phase unidirectional transducers) or RSPUDTs (resonant SPUDTs). An object of this invention is to provide a surface wave device resonator filter, particularly a SPUDT or RSPUDT resonator filter, with a balun function.

SUMMARY OF THE INVENTION

One aspect of this invention provides a surface wave device balun resonator filter comprising: a first surface wave device resonator filter comprising first and second transducers each having signal and ground connections; and a second surface wave device resonator filter comprising first and second transducers each having signal and ground connections, the second resonator filter being similar to the first resonator filter, a path between the signal connections of the first and second transducers of the second resonator filter having a phase difference of 180° relative to a path between the signal connections of the first and second transducers of the first resonator filter; the signal connections of the first transducers of the first and second resonator filters being coupled together to form an unbalanced port of the balun resonator filter, and the signal connections of the second transducers of the first and second resonator filters forming a balanced port of the balun resonator filter.

Preferably at least one, and preferably each, of the first and second transducers of each of the first and second resonator filters comprises a SPUDT (single phase unidirectional transducer), which is preferably an RSPUDT (resonant SPUDT). The first and second resonator filters can conveniently be provided on a single piezoelectric substrate, which can include a groove between the resonator filters to avoid coupling of surface waves between the resonator filters. One of the first and second transducers of the second resonator filter can be a mirror image of the corresponding one of the first and second transducers of the first resonator filter to provide the phase difference of 180°.

Another aspect of this invention provides a surface wave device comprising first and second SPUDT (single phase unidirectional transducer) resonator filters each comprising first and second transducers, the first and second resonator filters providing signal paths with similar characteristics and a phase difference of 180°, signal connections of the first transducers of the first and second resonator filters being coupled together to form an unbalanced port of the surface wave device, and signal connections of the second transducers of the first and second resonator filters forming a balanced port of the surface wave device.

A further aspect of the invention provides a surface wave device balun resonator filter comprising: a first SPUDT (single phase unidirectional transducer) resonator filter comprising first and second transducers; a second SPUDT resonator filter comprising first and second transducers, the second resonator filter being substantially the same as the first resonator filter except that one of its transducers is a mirror image of a corresponding one of the transducers of the first resonator filter; an unbalanced signal connection to the first transducers of the first and second resonator filters; and a balanced signal connection comprising signal connections to the second transducer of each of the first and second resonator filters.

BRIEF DESCRIPTION OF THE DRAWINGS

The invention will be further understood from the following description with reference to the accompanying drawings, in which.

DETAILED DESCRIPTION

Figure 1:
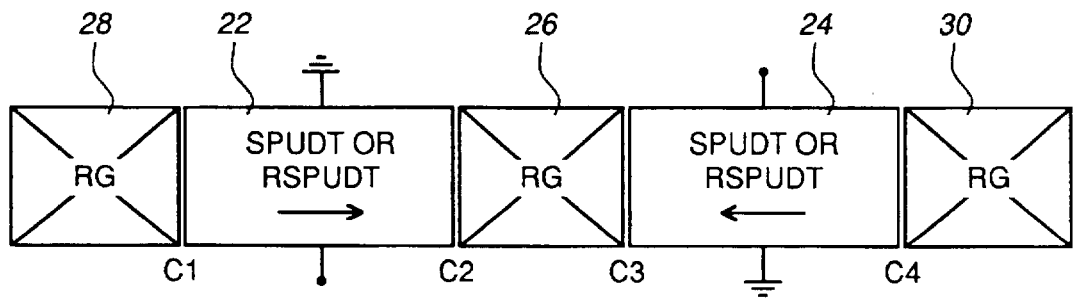
FIG. 1 schematically illustrates a general form of a SPUDT or RSPUDT resonator filter.

Referring to the drawings, FIG. 1 illustrates a general form of a SPUDT or RSPUDT resonator filter as described in the related application referred to above. The plane of the drawing represents a surface of a piezoelectric substrate. The resonator filter comprises two SPUDTs or RSPUDTs 22 and 24 which are aligned in the direction of surface wave propagation and are coupled via a central reflection grating (RG) 26 which provides partial reflection and partial transmission of surface waves, between two lateral RGs 28 and 30. Although the transducers 22 and 24 are referred to as being unidirectional, they are more accurately bidirectional with a predominant surface wave propagation direction which is represented in the drawings by an arrow for each transducer. FIG. 1 also illustrates unbalanced (i.e. signal and ground) connections to the transducers 22 and 24.

Assuming initially that the transducers 22 and 24 are SPUDTs, the resonator filter of FIG. 1 provides for four resonant cavities C1 to C4 at the transitions between the transducers and the RGs. The filter can be designed (with input and/or output matching circuits provided in known manner) to have a good close-in rejection and a substantially flat pass band, and can provide various desirable features of a resonator filter, such as low insertion loss, no TTI and hence a potentially ripple-free pass band, no need for acoustic absorbers, and ease of frequency trimming. The filter can have a small aperture, for example about 26λ where λ is the wavelength of the propagated surface waves, so that the piezoelectric substrate can also be small.

The use of RSPUDTs for the transducers 22 and 24, each RSPUDT having at least one internal resonant cavity, enables a further improvement in that the design can be more flexible to enable characteristics of the resonator filter to be more precisely defined. The different resonant cavities can be designed to have slightly different resonant frequencies within the pass band of the resonator filter, to produce an overall desired filter response including a flat pass band and good close-in rejection. As the use of RSPUDTs rather than SPUDTs for the transducers 22 and 24 provides a desirable improvement in filter performance, the following description refers primarily to RSPUDTs, but it can be appreciated that generally SPUDTs may be used instead of the RSPUDTs referred to.

Figure 2:
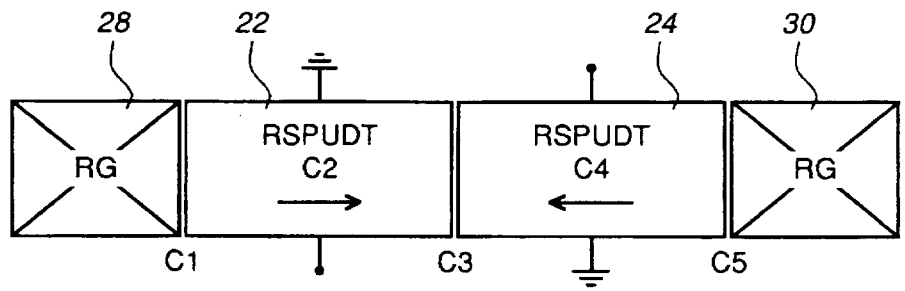
FIGS. 2, 3, and 4 schematically illustrate various modified forms of resonator filter.

The central RG 26 can be omitted from the resonator filter of FIG. 1 to produce an alternative form of the resonator filter which, as illustrated in FIG. 2, comprises the two RSPUDTs 22 and 24 between the two lateral RGs 28 and 30. This resonator filter provides three resonant cavities C1, C3, and C5 at the transitions between the RGs and the RSPUDTs, and at least one resonant cavity C2, C4 in each RSPUDT 22, 24.

Figure 3:
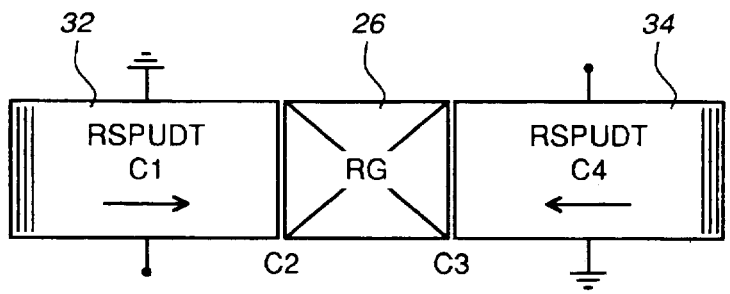
Figure 4:
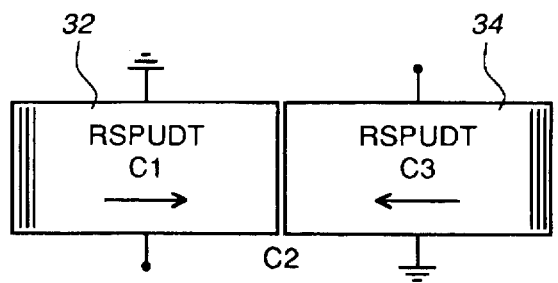

An improvement in performance of the resonator filters of FIGS. 1 and 2 can be provided by replacing one or both of the lateral RGs 28 and 30 by weighting the RSPUDTs 22 and 24 to act as reflectors at their outer ends; the weighting can comprise apodization or withdrawal weighting as described further below. For example, FIGS. 3 and 4 illustrate the resonator filters of FIGS. 1 and 2 respectively with both of the lateral RGs 28 and 30 replaced in this manner. In each case each RSPUDT is illustrated as having one resonant cavity, and the resonant cavities are identified by the references C1, C2, etc.

Thus the resonator filters of FIGS. 3 and 4 are similar to the resonator filters of FIGS. 1 and 2 respectively, except that the RSPUDT 22 and RG 28 are replaced by an RSPUDT 32 which is weighted, at its left-hand or outer end as illustrated by vertical lines, to act as a reflector, and the RSPUDT 24 and RG 30 are replaced by an RSPUDT 34 which is also weighted, at its right-hand or outer end as illustrated by vertical lines, to act as a reflector. With the RSPUDTs 32 and 34 each having one resonant cavity, the resonator filter of FIG. 3 thus provides four resonant cavities C1 to C4, and the resonator filter of FIG. 4 provides three resonant cavities C1 to C3.

The number of poles of the resonator filter corresponds to the number of resonant cavities; thus for example the resonator filter of FIG. 3 is a 4-pole filter. Any desired order (number of poles) of resonator filter can be provided by appropriate choice of the number of resonant cavities. The resonator filters need not provide as many resonant cavities as are identified and described above. For example, a resonator filter can be provided in the form illustrated in FIG. 2 with no discontinuity or change in polarity between each RSPUDT and the respective lateral RG 28 or 30, so that resonant cavities are not formed at these transitions (C1 and C5 in FIG. 2) and the resonator filter has only three resonant cavities.

As discussed above, the RSPUDTs 32 and 34 can be weighted using apodization and/or withdrawal weighting. For example, both RSPUDTs 32 and 34 of a resonator filter as illustrated in FIG. 3 or 4 can be withdrawal weighted, or one can be withdrawal weighted and the other weighted by apodization. If each RSPUDT provides only one resonant cavity, each RSPUDT can be referred to as a WWSCR (withdrawal weighted single cavity RSPUDT) or as an ASCR (apodized single cavity RSPUDT).

Various forms of SPUDT are known, and each RSPUDT or SPUDT in the resonator filters described above can have any desired form. In particular, each elementary cell, occupying one wavelength of a SPUDT or RSPUDT in the direction of surface wave propagation, can comprise a conventional electrode width control (EWC) structure or an improved reflectivity EWC (IR-EWC) structure (also referred to as a DART or Distributed Acoustic Reflection Transducer). The EWC structure comprises, for each elementary cell, two electrodes each λ/8 wide with a gap of λ/8 between them, connected to ground and a signal line respectively, and an electrode λ/4 wide connected to ground, thereby defining transduction and reflection centers spaced by 3λ/8. In the IR-EWC structure the width of the wide electrode is increased to 3λ/8, and the gaps between adjacent electrodes are all λ/8. The latter is preferred for its improved reflectivity and equal gaps.

Figure 5:
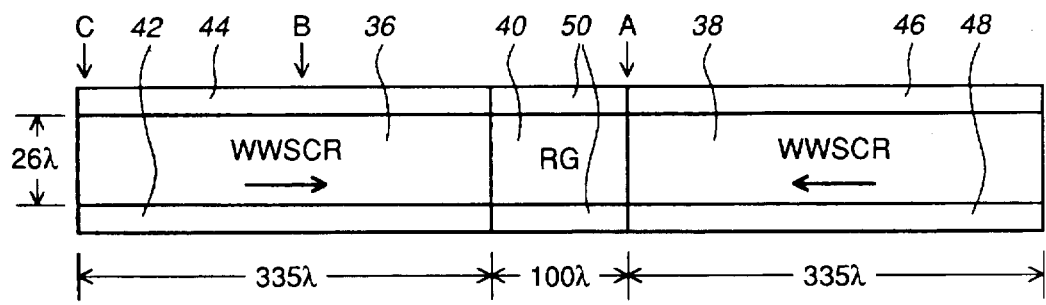
FIG. 5 schematically illustrates a particular form of resonator filter.
Figure 7:
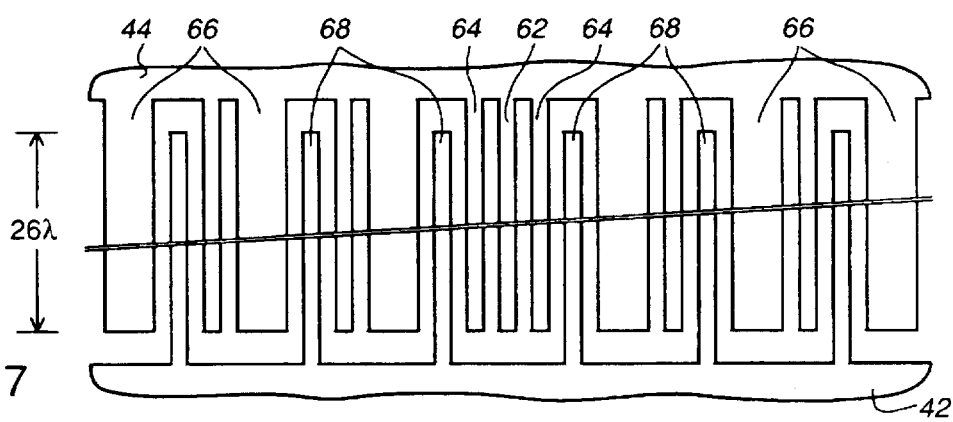
Figure 8:
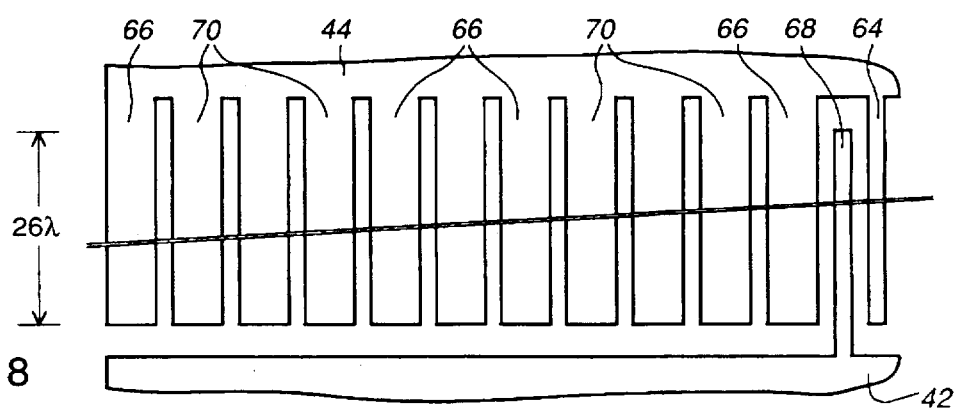

For completeness, one particular form of resonator filter is further described by way of example below with reference to FIGS. 5 to 8. FIG. 5 schematically illustrates the overall arrangement of the resonator filter, and FIGS. 6 to 8 schematically illustrate details of this filter at regions marked by arrows A, B, and C respectively in FIG. 5.

Referring to FIG. 5, the resonator filter has the form described above with reference to FIG. 3, providing four resonant cavities using two WWSCRs 36, 38 and a central RG 40. As illustrated (not to scale) in FIG. 5, each WWSCR has a length, in the direction of surface wave propagation, of about 335λ and an aperture of about 26λ, and the RG 40 has a length of about 100λ and a corresponding aperture. In the same manner as illustrated in FIG. 3, signal and ground connections are made to the WWSCR 36 via conductors 42 and 44 respectively, and to the WWSCR 38 via conductors 46 and 48 respectively. A ground connection is made to conductors 50 of the RG 40, or the RG 40 can instead be electrically floating. The two WWSCRs 36 and 38 have slightly different withdrawal weighting functions in order to reduce spurs in the filter response, and use the IR-EWC structure outlined above.

Figure 6:
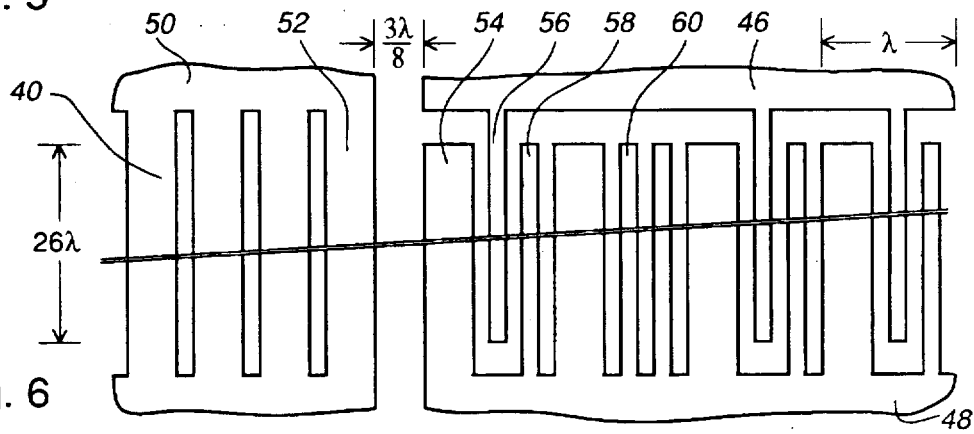
FIGS. 6, 7, and 8 schematically illustrate details of the resonator filter of FIG. 5.

The region A in FIG. 5 provides a resonant cavity (C3 in FIG. 3) between the WWSCR 38 and the RG 40 and is shown in detail in FIG. 6; a similar resonant cavity (C2 in FIG. 3) is formed between the WWSCR 36 and the RG 40. The region B, which is offset from the center along the length of the WWSCR 36, provides a resonant cavity (C1 in FIG. 3) due to a sign change in the IR-EWC structure as is shown in detail in FIG. 7. A similar resonant cavity (C4 in FIG. 3) is provided along the length of the WWSCR 38. The region C, at the outer end of the WWSCR 36, provides reflection of surface waves by withdrawal weighting and is shown in detail in FIG. 8. A similar reflection by withdrawal weighting is provided at the outer end of the WWSCR 38. Consequently, lateral RGs are not provided in this resonator filter.

In the IR-EWC structure used in the resonator filter of FIGS. 5 to 8, an elementary cell occupying one wavelength $\lambda$ in the direction of surface wave propagation comprises a $3\lambda/8$ wide finger connected to the grounded conductor and forming a reflection center RC, a $\lambda/8$ wide finger connected to the signal conductor and forming a transduction center TC, and a further $\lambda/8$ wide finger connected to the grounded conductor, with gaps of $\lambda/8$ between adjacent fingers. Withdrawal weighting is achieved by replacing the TC finger by a finger connected to the grounded conductor. This and the adjacent $\lambda/8$ wide finger can be replaced by a single $3\lambda/8$ wide finger connected to the grounded conductor to create an additional RC, and the same applies to each elementary cell. Consequently, transduction and reflection can be largely independently determined over the length of each WWSCR to provide a desired filter response.

Referring to FIG. 6, the RG 40 comprises only reflecting fingers each $3\lambda/8$ wide with $\lambda/8$ gaps between them, the fingers being connected to ground via the conductors 50. The resonant cavity in the region A is formed by a gap of $3\lambda/8$ between an end reflecting finger 52 of the RG 40 and an end RC finger 54 of the WWSCR 38. A TC finger 56 is connected to the signal conductor 46, and an adjacent further finger 58 is connected to the grounded conductor 48. FIG. 6 also shows in the next elementary cell a finger 60 that is withdrawn, i.e. converted from being a TC finger to a neutral finger, in accordance with a desired withdrawal weighting function, by connecting it to the grounded conductor 48 instead of the signal conductor 46.

Referring to FIG. 7, in the region B of the WWSCR 36 an additional $\lambda/8$ wide finger 62 is provided and connected to the grounded conductor 44 with $\lambda/8$ gaps between the further fingers 64 of cells of the WWSCR which have opposite predominant directions of surface wave transmission, in each case towards the additional finger 62. Thus to the left of the additional finger 62, in each elementary cell the RC finger 66 connected to the grounded conductor 44 is to the left of the TC finger 68 connected to the signal conductor 42, whereas to the right of the additional finger 62, in each elementary cell the RC finger 66 is to the right of the TC finger 68. In consequence, a resonant cavity is formed in the region B. The TC and RC functions of the overall WWSCR 36 are arranged so that there is a predominant direction of surface wave propagation to the right as shown by the arrow in FIG. 5.

Referring to FIG. 8, in the region C at the outer end of the WWSCR 36 nearly all of the TC fingers 68 connected to the signal rail 42 and the adjacent further fingers 64 connected to the grounded conductor 44 are replaced by $3\lambda/8$ wide fingers 70 connected to the grounded conductor 44, thereby forming additional RCs between the original RC fingers 66, in accordance with a desired RC weighting function that makes the WWSCR 36 a good surface wave reflector in the region C.

Although the resonator filters described in detail above all use withdrawal weighting, it can be appreciated that weighting can alternatively be achieved by apodization of the transducers in accordance with a desired weighting function. Apodization of transducers is known in the art and need not be further described here; for example, IDTs using alternatively withdrawal weighting or apodization are known from Kodama et al. U.S. Pat. No. 4,866,325 issued Sep. 12, 1989 and entitled "Surface Acoustic Wave Transducer". However, it is observed that withdrawal weighting may be preferred because it avoids a so-called apodization loss which is inherent in apodized transducers.

Each of the resonator filters as described above, as clearly shown by the signal and ground connections in FIGS. 1 to 4, provides single-ended or unbalanced input and output connections or ports. It is desirable to provide a resonator filter which not only has the advantages of the resonator filters as described above, but also provides a balun function between its input and output ports, i.e. which has an unbalanced input and a balanced output, or a balanced input and an unbalanced output. Embodiments of such a resonator filter in accordance with this invention are illustrated in FIGS. 9 and 10 and are described below.

Figure 9:
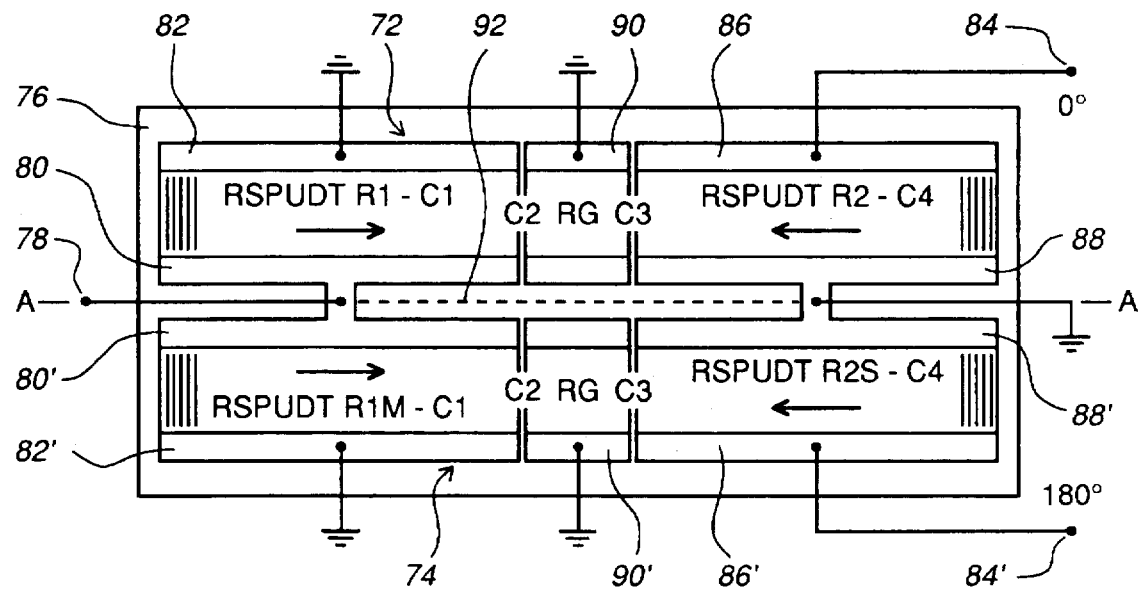
FIGS. 9 and 10 schematically illustrate forms of resonator filter providing a balun function, in accordance with embodiments of the invention.
Figure 10:
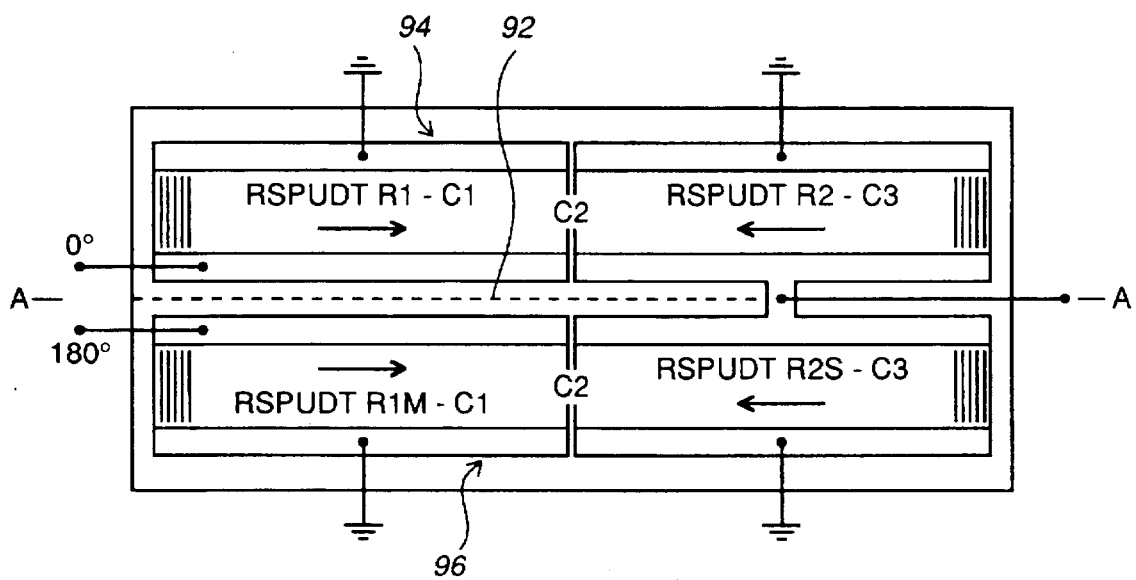

The balun resonator filter illustrated in FIG. 9 comprises two resonator filters 72 and 74 arranged side by side on a surface of a piezoelectric substrate 76. A center line extending between the two resonator filters 72 and 74, parallel to the direction of surface wave propagation, is denoted A—A for reference.

The resonator filter 72 is as described above with reference to FIG. 3, comprising RSPUDTs R1 and R2, providing resonant cavities C1 and C4 respectively, and a central reflection grating RG, with resonant cavities C2 and C3 between the reflection grating RG and the RSPUDTs R1 and R2 respectively. A single-ended or unbalanced terminal 78 is connected to a conductive rail 80 of the RSPUDT R1, the other conductive rail 82 of which is grounded. One terminal 84, referenced 0°, of a pair of balanced terminals 84, 84' is connected to a conductive rail 86 of the RSPUDT R2, the other conductive rail 88 of which is grounded. The reflection grating RG can be electrically floating, or grounded via a conductive rail 90 as illustrated.

The resonator 74 is identical to the resonator filter except for the phasing of its RSPUDTs which are referenced R1M and R2S. Thus, using primed references corresponding to those for the resonator filter 72, the unbalanced terminal 78 is also connected to a conductive rail 80' of the RSPUDT R1M, the other conductive rail 82' of which is grounded. The other terminal 84', referenced 180°, of the pair of balanced terminals 84, 84' is connected to a conductive rail 86' of the RSPUDT R2S, the other conductive rail 88' of which is grounded. The reflection grating RG can be electrically floating, or grounded via a conductive rail 90' as illustrated. The same resonant cavities C1 to C4 as for the resonator filter 72 are provided in the resonator filter 74 by the RSPUDT R1M, between the reflection grating RG and the RSPUDTs R1M and R2S, and by the RSPUDT R2S respectively.

The resonator filter 74 differs from the resonator filter 72 only in that the layout and electrodes of the RSPUDT R1M are a mirror image, about the center line A—A, of the layout and electrodes of the RSPUDT R1, whereas the layout and electrodes of the RSPUDT R2S are the same as the layout and electrodes of the RSPUDT R2, i.e. they are simply translated or shifted in the plane of the surface of the piezoelectric substrate 76. Consequently, the path between the terminals 78 and 84' has a phase change of 180° compared with the path between the terminals 78 and 84, whereby the terminals 84, 84' provide a balanced termination (input or output) for the resonator filter, a good balance being provided by the similarity of the resonator filters 72 and 74.

It is observed that the two resonator filters 72 and 74 can be close together with only a small gap between them.

Propagated surface waves are relatively well constrained within the apertures of the filters because these are resonator filters, so that there is little or no coupling of surface waves between the two resonator filters. In order to reduce any coupling that may occur, the surface of the piezoelectric substrate 76 can be provided with a groove along part or all of the length of the center line A—A between the resonator filters 72 and 74, as shown by a dashed line 92 in FIG. 9. Alternatively, the resonator filters 72 and 74 can be provided on separate, individual piezoelectric substrates which are mounted in the same package.

In this respect it is also observed that the small width of each resonator filter and their close spacing enables the balun resonator filter, having twice the width of a single resonator filter, to be accommodated in the same size of package as a single unbalanced resonator filter. For example, a balun resonator filter as illustrated in FIG. 9 for use at an IF of about 200 MHz can be provided on a piezoelectric substrate 76 of the order of 12 mm long and 2 mm wide, each resonator filter (including the conductive rails) being of the order of 0.7 mm wide, with a gap of the order of 0.2 mm between the resonator filters. Such a balun resonator filter can be accommodated in the same size of package as is used for a corresponding unbalanced resonator filter, for example as described with reference to FIG. 3, which would require a piezoelectric substrate of the order of 12 mm long and 1 mm wide.

It can be appreciated that FIG. 9 illustrates by way of example only one of numerous alternative arrangements of balun resonator filter in accordance with this invention. In particular, it is observed that each of the two resonator filters can have any of the forms and alternatives described above with reference to FIGS. 1 to 4, and can use SPUDTs or RSPUDTs. Different connection arrangements can be provided for the two filters, it only being necessary that the two resonator filters provide a phase difference of 180° for the two signal paths between an unbalanced connection and a pair of balanced connections. Thus, for example, instead of being as described above and illustrated in FIG. 9, for the resonator filter 74 the RSPUDT R1 could be shifted and the RSPUDT R2 could be mirrored about the line A—A, and/or individual signal and ground connections to the RSPUDTs could be interchanged. Alternatively, for the resonator filter 74 both of the RSPUDTs R1 and R2 could be mirrored about the line A—A, or both could be shifted, and the phase difference of 180° could be provided by interchanging connection wires to the resonator filters. (For example, in FIG. 9 the mirrored RSPUDT R1M could instead be a shifted version of the RSPUDT R1, with the upper rail 80' connected to ground and the lower rail 82' connected to the terminal 78. The common bonding pad shown in FIG. 9 between the rails 80 and 80' would, of course, not be present in this case.) However, this is not preferred, especially at high frequencies, because of the need for and imbalancing effects of the connection wires.

It can also be appreciated that the invention is especially advantageous when applied to RSPUDT and SPUDT resonator filters as described above because such resonator filters can provide a desired filter order (e.g. a 4-pole filter) in a very narrow structure, and providing two such structures side by side in the same package is very practical. However, the principles of the invention can if desired also be applied to other types of resonator filter, for example WCR and LCR filters as described in the background of the invention. However, this is much less advantageous and practical because a balun structure can be provided otherwise for such resonator filters, and their widths (and hence package sizes) are much greater both by virtue of the structure of the resonator filter itself and by a need to cascade two or more such filters to provide the desired filter order, so that a further doubling to provide a balun function in accordance with this invention is undesirable in practice.

FIG. 10 illustrates one alternative form of balun resonator filter, in which the two resonator filters 94 and 96 each have the form described above with reference to FIG. 4, providing three resonant cavities C1 to C3. In this balun resonator filter the balanced terminals are connected to non-grounded inner conductive rails of RSPUDTs R1 and R1M mirrored about the center line A—A, and the unbalanced terminal is connected to inner conductive rails of RSPUDTs R2 and R2S, with the other, outer, conductive rails of all of the RSPUDTs being grounded. As described above and shown by the dashed line 92, a groove can be provided along part or all of the length of the center line A—A between the resonator filters 94 and 96.

Although particular embodiments of the invention have been described in detail, it should be appreciated that numerous modifications, variations, and adaptations may be made without departing from the scope of the invention as defined in the claims.

What is claimed is:

1. A surface wave device balun resonator filter comprising:

a first surface wave device resonator filter comprising first and second transducers each having signal and ground connections; and a second surface wave device resonator filter comprising first and second transducers each having signal and ground connections, the second resonator filter being similar to the first resonator filter, a path between the signal connections of the first and second transducers of the second resonator filter having a phase difference of 180° relative to a path between the signal connections of the first and second transducers of the first resonator filter;

the signal connections of the first transducers of the first and second resonator filters being coupled together to form an unbalanced port of the balun resonator filter, and the signal connections of the second transducers of the first and second resonator filters forming a balanced port of the balun resonator filter.

2. A balun resonator filter as claimed in claim 1 wherein at least one of the first and second transducers of each of the first and second resonator filters comprises a SPUDT (single phase unidirectional transducer).

3. A balun resonator filter as claimed in claim 1 wherein each of the first and second transducers of each of the first and second resonator filters comprises a SPUDT (single phase unidirectional transducer).

4. A balun resonator filter as claimed in claim 3 wherein the first and second resonator filters are provided on a single piezoelectric substrate.

5. A balun resonator filter as claimed in claim 3 wherein one of the first and second transducers of the second resonator filter is a mirror image of the corresponding one of the first and second transducers of the first resonator filter to provide the phase difference of 180°.

6. A balun resonator filter as claimed in claim 1 wherein the first and second resonator filters are provided on a single piezoelectric substrate.

7. A balun resonator filter as claimed in claim 6 wherein the piezoelectric substrate includes a groove between the first and second resonator filters.

8. A balun resonator filter as claimed in claim 1 wherein each of the first and second transducers of each of the first and second resonator filters comprises an RSPUDT (resonant single phase unidirectional transducer).

9. A balun resonator filter as claimed in claim 8 wherein the first and second resonator filters are provided on a single piezoelectric substrate.

10. A balun resonator filter as claimed in claim 8 wherein one of the first and second transducers of the second resonator filter is a mirror image of the corresponding one of the first and second transducers of the first resonator filter to provide the phase difference of 180°.

11. A balun resonator filter as claimed in claim 1 wherein at least one of the first and second transducers of each of the first and second resonator filters comprises an RSPUDT (resonant single phase unidirectional transducer).

12. A balun resonator filter as claimed in claim 1 wherein one of the first and second transducers of the second resonator filter is a mirror image of the corresponding one of the first and second transducers of the first resonator filter to provide the phase difference of 180°.

13. A surface wave device comprising first and second SPUDT (single phase unidirectional transducer) resonator filters each comprising first and second transducers, the first and second resonator filters providing signal paths with similar characteristics and a phase difference of 180°, signal connections of the first transducers of the first and second resonator filters being coupled together to form an unbalanced port of the surface wave device, and signal connections of the second transducers of the first and second resonator filters forming a balanced port of the surface wave device.

14. A surface wave device as claimed in claim 13 wherein the second resonator filter is substantially the same as the first resonator filter except that one of its transducers is a mirror image of a corresponding one of the transducers of the first resonator filter to provide the phase difference of 180°.

15. A surface wave device as claimed in claim 14 wherein at least one of the first and second transducers of each of the first and second resonator filters comprises an RSPUDT (resonant SPUDT).

16. A surface wave device as claimed in claim 15 wherein the first and second resonator filters are provided on a single piezoelectric substrate.

17. A surface wave device as claimed in claim 16 wherein the piezoelectric substrate includes a groove between the first and second resonator filters.

18. A surface wave device as claimed in claim 13 wherein at least one of the first and second transducers of each of the first and second resonator filters comprises an RSPUDT (resonant RSPUDT).

19. A surface wave device as claimed in claim 18 wherein the first and second resonator filters are provided on a single piezoelectric substrate.

20. A surface wave device as claimed in claim 19 wherein the piezoelectric substrate includes a groove between the first and second resonator filters.

21. A surface wave device as claimed in claim 13 wherein the first and second resonator filters are provided on a single piezoelectric substrate.

22. A surface wave device as claimed in claim 21 wherein the piezoelectric substrate includes a groove between the first and second resonator filters.

23. A surface wave device balun resonator filter comprising:

a first SPUDT (single phase unidirectional transducer) resonator filter comprising first and second transducers;

a second SPUDT resonator filter comprising first and second transducers, the second resonator filter being substantially the same as the first resonator filter except that one of its transducers is a mirror image of a corresponding one of the transducers of the first resonator filter;

an unbalanced signal connection to the first transducers of the first and second resonator filters; and a balanced signal connection comprising signal connections to the second transducer of each of the first and second resonator filters.

24. A surface wave device as claimed in claim 23 wherein each of the first and second transducers of each of the first and second resonator filters comprises an RSPUDT (resonant SPUDT).

25. A surface wave device as claimed in claim 24 wherein the first and second resonator filters are provided on a single piezoelectric substrate.

26. A surface wave device as claimed in claim 25 wherein the piezoelectric substrate includes a groove between the first and second resonator filters.

27. A surface wave device as claimed in claim 23 wherein the first and second resonator filters are provided on a single piezoelectric substrate.

* * * * *